United States Patent
Goldman et al.

(10) Patent No.: US 9,754,683 B2
(45) Date of Patent: Sep. 5, 2017

(54) METHOD AND SYSTEM TO OBTAIN STATE CONFIDENCE DATA USING MULTISTROBE READ OF A NON-VOLATILE MEMORY

(75) Inventors: Matthew Goldman, Folsom, CA (US); Krishna K. Parat, Palo Alto, CA (US); Pranav Kalavade, San Jose, CA (US); Nathan R. Franklin, Belmont, CA (US); Mark Helm, Santa Cruz, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 13/977,011

(22) PCT Filed: Mar. 29, 2012

(86) PCT No.: PCT/US2012/031297
§ 371 (c)(1),
(2), (4) Date: Sep. 8, 2014

(87) PCT Pub. No.: WO2013/147811
PCT Pub. Date: Oct. 3, 2013

(65) Prior Publication Data
US 2014/0380108 A1 Dec. 25, 2014

(51) Int. Cl.
*G11C 29/00* (2006.01)
*G11C 29/50* (2006.01)
(Continued)

(52) U.S. Cl.
CPC .... *G11C 29/50004* (2013.01); *G06F 11/1048* (2013.01); *G06F 11/1068* (2013.01);
(Continued)

(58) Field of Classification Search
CPC ... G11C 29/50004; G11C 16/34; G11C 16/26; G11C 2029/5004; G11C 2029/0411; G11C 11/5642; G06F 11/1068; G06F 11/1048
See application file for complete search history.

(56) References Cited

U.S. PATENT DOCUMENTS

| 5,534,800 A | 7/1996 | Hiraki et al. |
| 2003/0137878 A1 | 7/2003 | Gonzalez et al. |

(Continued)

FOREIGN PATENT DOCUMENTS

| CN | 101711415 | 5/2010 |
| KR | 10-2010-0077499 A | 7/2010 |
| TW | I338365 | 11/2008 |

OTHER PUBLICATIONS

Office Action received for Taiwanese Patent Application No. 102106564. mailed May 4, 2015, 9 pages including 5 pages English translation.
(Continued)

*Primary Examiner* — Thien D Nguyen

(57) ABSTRACT

An apparatus may include a processor circuit a processor circuit to retrieve data from a non-volatile memory, and a multistrobe read module operable on the processor circuit to set a read operation to read a memory cell over a multiplicity of sense operations, where each sense operation is performed under a different sense condition. The multistrobe read module may be further operable to schedule a new sense operation to succeed a prior sense operation of the multiplicity of sense operations without recharge of the wordline when a value of one or more read condition is within a preset range. Other embodiments are disclosed and claimed.

27 Claims, 8 Drawing Sheets

(51) Int. Cl.
*G11C 16/26* (2006.01)
*G11C 16/34* (2006.01)
*G06F 11/10* (2006.01)
*G11C 11/56* (2006.01)
*G11C 29/04* (2006.01)

(52) U.S. Cl.
CPC .............. *G11C 16/26* (2013.01); *G11C 16/34* (2013.01); *G11C 11/5642* (2013.01); *G11C 2029/0411* (2013.01); *G11C 2029/5004* (2013.01)

(56) References Cited

U.S. PATENT DOCUMENTS

| | | |
|---|---|---|
| 2003/0161192 A1 | 8/2003 | Kobayashi et al. |
| 2005/0162913 A1 | 7/2005 | Chen |
| 2006/0050555 A1 | 3/2006 | Yeh |
| 2006/0170028 A1 | 8/2006 | Jeon et al. |
| 2008/0019182 A1 | 1/2008 | Yanagidaira et al. |
| 2008/0247238 A1 | 10/2008 | Nguyen et al. |
| 2009/0244973 A1 | 10/2009 | Scheppler et al. |
| 2010/0165738 A1 | 7/2010 | Cernea |
| 2011/0058430 A1* | 3/2011 | Chen ................ G11C 7/1006 365/189.05 |
| 2011/0131473 A1* | 6/2011 | Mokhlesi ........... G11C 11/5642 714/773 |
| 2011/0179321 A1* | 7/2011 | Takeuchi ............... G11C 29/50 714/718 |
| 2011/0194357 A1 | 8/2011 | Han et al. |
| 2011/0197015 A1* | 8/2011 | Chae ................ G11C 11/5642 711/103 |
| 2011/0246855 A1* | 10/2011 | Cheng ................ G06F 11/1068 714/759 |
| 2011/0305099 A1* | 12/2011 | Sharma ................ G11C 7/12 365/203 |
| 2012/0051144 A1* | 3/2012 | Weingarten ............ G11C 16/26 365/185.24 |
| 2012/0134198 A1* | 5/2012 | Yamaguchi ........... G11C 11/419 365/154 |
| 2012/0155186 A1* | 6/2012 | Chokan .............. G11C 16/3459 365/185.22 |
| 2012/0320672 A1* | 12/2012 | Meir ....................... G11C 7/06 365/185.03 |

OTHER PUBLICATIONS

International Search Report and Written Opinion, Mailed Date: Nov. 23, 2012, Application No. PCT/US2012/031297, Filed Date: Mar. 29, 2012, pp. 9.

Office Action and Search Report received for Taiwanese Patent Application No. 102106564, mailed Jan. 26, 2016, 20 pages including 9 pages English translation.

Office Action and Search Report received for Chinese Patent Application No. 201280072022.8, mailed Apr. 11, 2016, 6 pages (untranslated).

* cited by examiner

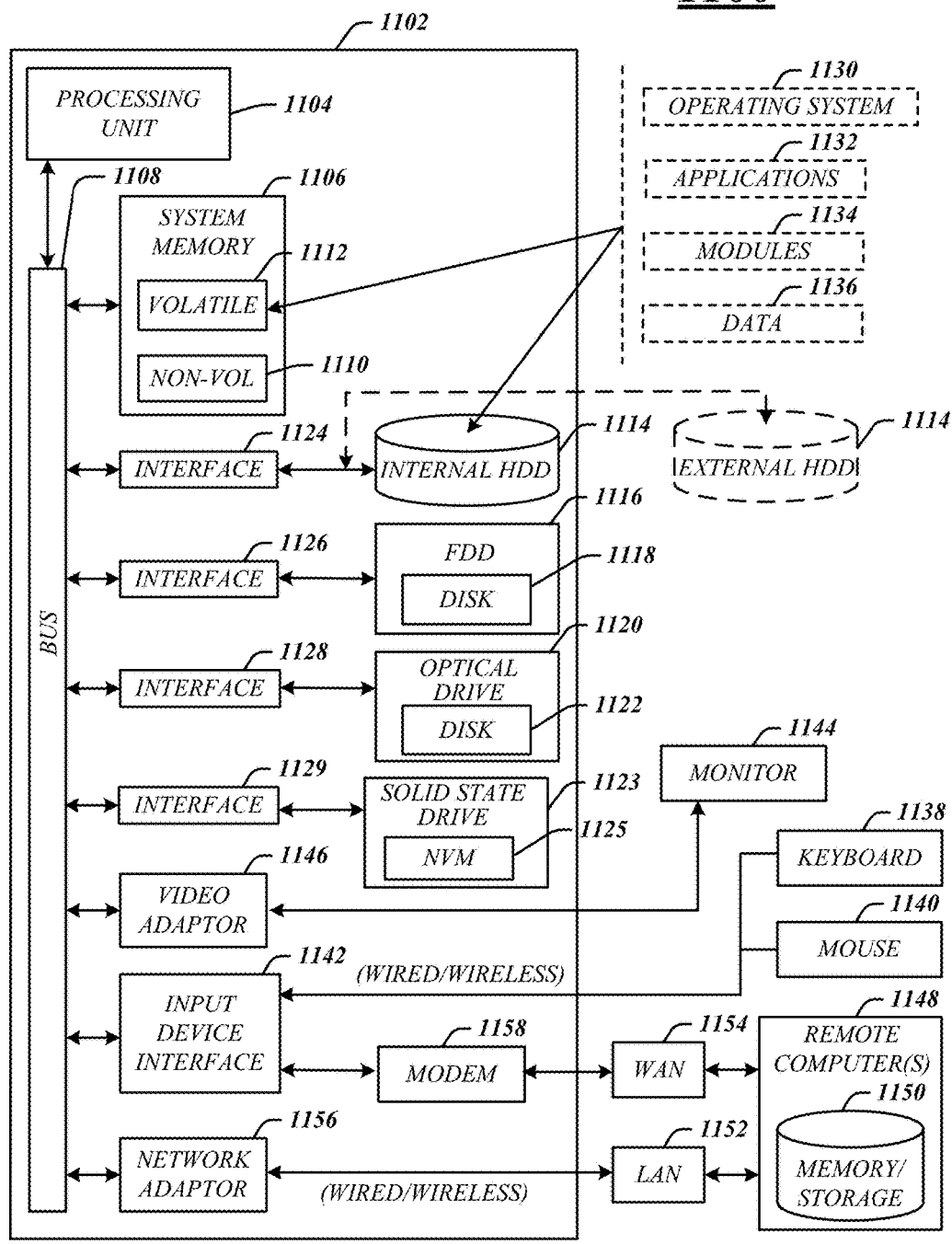

METHOD AND SYSTEM TO OBTAIN STATE CONFIDENCE DATA USING MULTISTROBE READ OF A NON-VOLATILE MEMORY

BACKGROUND

As cell dimensions in memory devices scale to smaller dimensions, the integrity of data storage is challenged. In particular, the raw bit error rate in non-volatile memory devices such as NAND flash memory has been observed to increase with decreasing cell size. NAND technology relies on an error correction code (ECC) process to compensate for bits that may spontaneously fail during normal device operation.

In order to achieve a tolerable bit error rate, an error correction engine is typically employed at the system level. The most common ECC that has been employed in recent generations of NAND products uses a so-called BCH code (the acronym is derived from the inventor's names Bose, Ray-Chaudhuri, and Hocquenghem). However, BCH code may not be able to deliver the error correction capability that may be required in future generation NAND products where the cell size is smaller.

On the other hand, error codes such as the low density parity check (LDPC) provide greater capability but require that a NAND memory provide data in a different manner than conventional user data. Unlike the BCH method, LDPC code involves providing, in addition to each bit value, so-called state confidence data, which is data that provides an estimate of the bit's reliability. LDPC can yield significant correction capability gains over BCH, because the decoder is able to determine which bits are more likely to be flipped and can use this information in its correction algorithms. However, efficient methods for generating state confidence data from a memory without unduly affecting performance are lacking.

Accordingly, there may be a need for improved techniques and apparatus to solve these and other problems.

BRIEF DESCRIPTION OF THE DRAWINGS

FIG. 7b depicts a scenario for reading the multilevel memory of FIG. 7a.
FIG. 11 is a diagram of an exemplary system embodiment.

DETAILED DESCRIPTION

Figure 1:
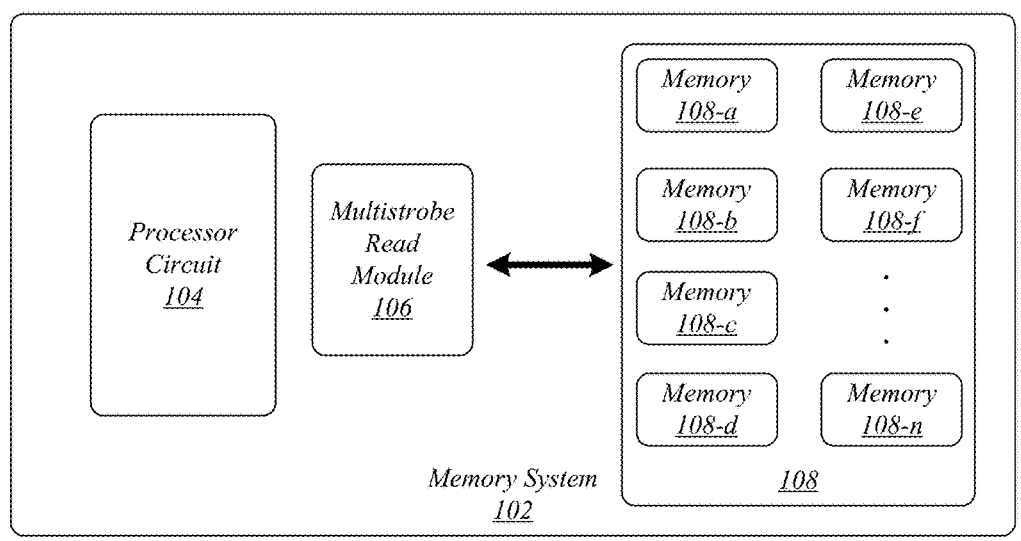
FIG. 1 depicts a block diagram of a system embodiment.

Various embodiments involve novel system, apparatus, and methods to read data. In particular, methods and apparatus of the present embodiments may treat stored data to determine the likelihood of data errors. Various embodiments are directed to generation of state confidence data and treatment of that data so that more accurate and efficient error correction may be applied. In particular, embodiments are directed to methods of performing read operations that involve multiple sensing of a memory to generate state confidence data in a manner that is efficient and timely. Unless otherwise noted, the terms "state confidence data" and "state confidence information" are interchangeable, and the terms "confidence" and "state confidence" may additionally be used interchangeably.

In various embodiments, the data to be corrected may be stored in a non-volatile memory array, such as a NAND flash memory, phase change memory (PCM), a spin memory; phase change memory with switch (PCMS), magnetoresistive random access memory (MRAM), spin memory, nanowire memory, ferroelectric transistor random access memory (FeTRAM), or other memory from which it may be desirable to extract state confidence data regarding information stored in the memory.

In a non-volatile memory such as NAND flash memory, floating-gate transistors are used to store charge, which controls the threshold voltage ($V_T$) required to turn on the floating-gate transistor that controls a given memory cell. The $V_T$ level for a given memory cell in turn is used to determine the logic state of that memory cell. In the NAND flash architecture, a memory array is connected to word lines and bit lines in which several transistors are connected in series. Only if all word lines are pulled high (above the transistors' $V_T$) is the bit line pulled low. To perform a read operation, most of the word lines are pulled up above the $V_T$ of a programmed bit, while one is pulled up to just over the $V_T$ of an erased bit. The series group will conduct (and pull the bit line low) if the selected bit has not been programmed.

As memory size of NAND flash increases, the separation between adjacent cells decreases and the likelihood of error generation increases, as noted. To address this issue, various embodiments provide improved methods of reading NAND devices so that the logical state of a memory cell can be more accurately and efficiently determined. In particular, as detailed below, the present embodiments provide novel procedures for efficiently managing data read operations that entail performing multiple sense operations on a memory cell to generate state confidence information that may be used to perform error correction according to advanced techniques, such as LDPC.

In various embodiments, data for processing by an LDPC engine may be generated through repeated application of data sense operations to a memory cell in which the sense conditions are to be varied between each sense operation. In conjunction with each sense operation, one or more other read parameters may be adjusted in advance of that sense operation. State confidence information from the results of the multiple sense operations may be encoded and stored for parsing to an external device (also referred to herein as "customer"), such as an external controller, after the data sense operations are complete.

As detailed with respect to the FIGS. to follow, in various embodiments, the state confidence data may be provided by a multistrobe read process that senses and encodes data after each sense operation without parsing the data to an external device until all sense operations of a multiple sense operation read procedure are performed. In addition, various read parameters may be adjusted as needed between sense operations. This may provide several advantages including the ability to avoid adjusting wordline voltage and recharging a bitline, except when determined to be needed. In this manner, each sense operation may be cycled through in an efficient manner while read operations under each sense condition are optimized. This multistrobe read process contrasts with a serial sensing procedure, in which state confidence data may be generated and parsed out to an external device after each of multiple sense operations. In the latter process, the wordline voltage may also be adjusted after each sense operation, followed by charging of the bitline and wordline in preparation for the next sensing procedure, resulting in a relatively longer duration to cycle through multiple sense operations.

Moreover, the present embodiments provide a system that has flexibility to monitor and adjust one or more of multiple read parameters between sense operations. Such read parameters may include bitline precharge state, sense voltage, sense time, wordline voltage, bitline voltage. In some embodiments, the system provides the ability to determine whether bitline refilling is to take place during a process of multiple sensing of a memory cell, and, if so, between which sense operations bitline refilling should be performed. Other embodiments provide the ability to determine whether a bitline discharge path is to remain enabled, and to determine how many sense operations are to take place before parsing out data including state confidence information to an external device.

Methods in accordance with the present embodiments provide design criteria that may be used by an external device to optimize error correction performance. In some embodiments, the methods may employ a multistrobe read process to optimize one or more read parameters during the multistrobe read process in order to improve or minimize a property, such as error rate generated by a data read process that includes error correction. The design criteria may provide different combinations of adjustments to read parameters so that performance can be adjusted according to a customer's needs.

FIG. 1 depicts an embodiment of a memory system 102 that may be employed to perform multistrobe read of a memory. In a multistrobe read procedure, a read of non-volatile a memory element, such as a memory cell, may be carried out by performing multiple sense operations of the memory cell, varying sense conditions between sense operations, storing encoded data after each sense operation, and parsing out the encoded stored data only after all sense operations are complete. The memory system 100 includes a processor circuit 104, a multistrobe read module 106, and a non-volatile memory 108, which may include multiple memory units 108-a to 108-n, where the integers, a, b, c, d, e, f, and n represents any positive integer and may represent the same or different integers.

The memory system 102 may be coupled to an external device (not shown) that requests data to be read from non-volatile memory 108. If the data to be read from non-volatile memory 108 is to include state confidence information, the multistrobe read module 106 may determine that a multistrobe read process is to be performed on non-volatile memory 108 in order to provide the data together with state confidence information to the external device.

In particular, the multistrobe read module may manage a series of sense operations that sense the requested data under slightly different sense conditions for each sense operation. Moreover, as detailed below, the multistrobe read module 106 may provide data and state confidence information from the memory read for encoding and storage in a local storage such as a cache, without having the data/state confidence information parsed to an external device until all of the series of sense operations are complete.

Figure 2:
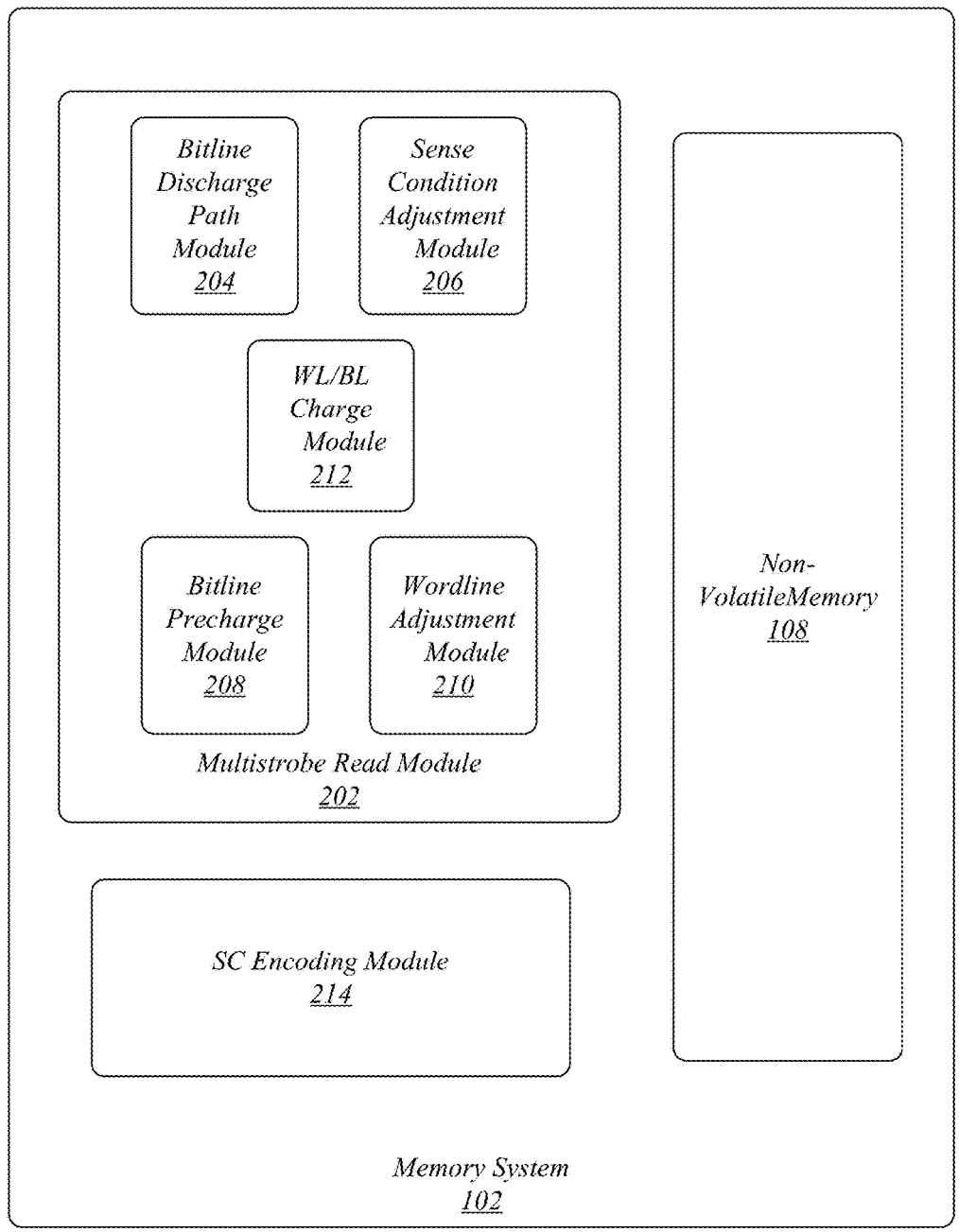
FIG. 2 depicts a block diagram of another system embodiment.

FIG. 2 presents a block diagram of an embodiment of a memory system 102 that includes details of a multistrobe read module 202. As shown, the multistrobe read module 202 may include multiple components such as a bitline discharge path module 204, a sense condition adjustment module 206, a bitline precharge module 208, a wordline adjustment module 210, and a wordline/bitline (WL/BL) charge module 212. Consistent with the present embodiments, the multistrobe read module 202, as well as its components, may include hardware, software, or a combination of hardware and software. Each of the components may be employed to adjust read conditions for performing a multistrobe read operation, and in particular, to adjust read conditions between each sense operation of the multistrobe read operation. Thus, when data that includes state confidence data is to be read from a memory address, the multistrobe read module may employ one or more of the bitline discharge path module 204, sense condition adjustment module 206, bitline precharge module 208, WL/BL charge module 212, and wordline adjustment module 210 to control read conditions until all the sense operations of the multistrobe read operation are complete.

As further illustrated in FIG. 2, the memory system 102 may include a state confidence (SC) encoding module 214 arranged to receive results of each sense operation of a series of sense operations, and to encode the results as a multiple bit encoded output. The encoded output may subsequently be parsed to an external device after the series of sense operations are complete.

The state confidence encoding module 214 may operate to provide state confidence data to be processed by an error correction code (ECC) engine (not shown) in order to perform an ECC operation, such as the aforementioned LPDC procedure. This may be especially useful to read high density memories in which the cell size is sufficiently small that error rates are significant, leading to the ineffectiveness of traditional codes, such as BCH, when applied to correct data read from such memories.

One result of the increased scaling of memory arrays, such as flash NAND, to smaller and smaller dimensions is the difficulty in distinguishing one logical state from another logical state. In flash NAND memory, each memory cell is controlled by a floating gate transistor that is used to store charge in a manner that distinguishes a logical "0" from a logical "1." A logical state of the memory cell may be characterized by the threshold voltage required to turn the floating gate transistor on, which, in turn, is controlled by the amount of charge resident in the floating gate. In a memory array, memory cells of a first logical state may be set to a first nominal threshold voltage, while memory cells of a second logical state are set to a second nominal threshold voltage. During a read process, the sense voltage may be set to a reference voltage corresponding to a threshold voltage sufficient to turn on floating gate transistors of memory cells set to the first logical state without being sufficient to turn on floating gate transistors set to the second logical state. Thus, when a block of NAND memory is read by placing the sense voltage at the reference voltage, the transistors in all memory cells in the pages of that block that are set to the second logical state should remain off.

However, in typical memory arrays, different memory cells exhibit a different threshold voltage that spans a range (distribution) of threshold voltages. Moreover, in current and future generation flash NAND memory, the distribution of threshold voltage for a first logical state may unintentionally overlap the distribution of threshold voltage for a second logical state. In such circumstances, it may not be possible or may be difficult to determine the actual logical state of a memory cell based on a sense operation that places the sense reference voltage at a midpoint value between the mean values of the two distributions. In such cases, it may be desirable to perform a series of sense measurements of a given memory cell and provide the results of such sense measurements in the form of state confidence data that can be processed by an ECC engine, such as an LDPC engine, in order to properly assess and correct data as needed.

The memory system 102 thereby facilitates determining the effect of varying one or more read parameters in a multistrobe read process so that read performance in devices, such as flash NAND memory devices can be optimized, and in particular, error correction in data read operations can be improved.

Figure 3:
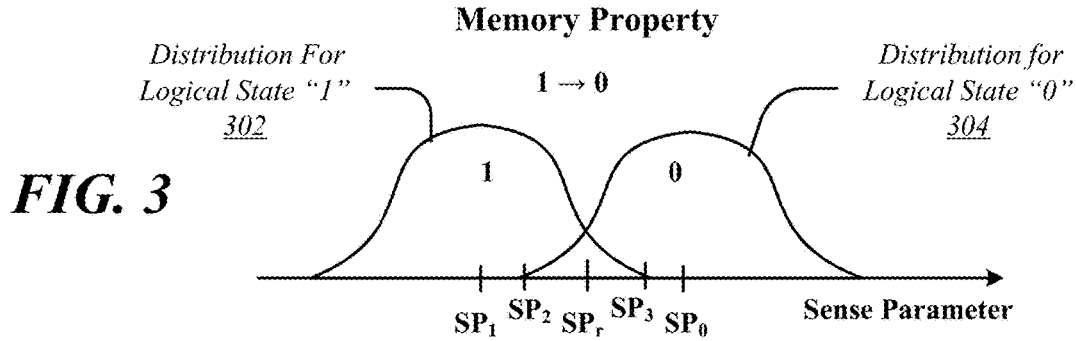
FIG. 3 illustrates an example of memory properties.

FIG. 3 illustrates an example of memory properties of a non-volatile memory that may be read according to the present embodiments. In particular, FIG. 3 illustrates two different distributions associated with respective logical states "1" and "0" of a memory array. As shown, a first sense parameter distribution 302 represents the logical state "1" and a second sense parameter distribution 304 represents the logical state "0." The term "sense parameter" refers to such parameters as sense voltage or duration of time when a sense pulse is applied to measure the logical state of a memory cell. As is evident, the sense parameter distribution 302, characterized by a peak at $SP_1$, overlaps the sense parameter distribution 304, characterized by a peak at $SP_0$. In the case in which the sense parameter represents threshold voltage, there is sufficient overlap in the distributions that create an uncertainty as to the results of sense measurement, such as one performed at $SP_r$, which may represent a reference voltage representing the threshold voltage intermediate between that characteristic of logical states "1" and "0," that is, intermediate between points $SP_1$ and $SP_0$.

In order to address the situation presented in FIG. 3, multiple sense operations may be conducted at slightly different sense conditions, and the results sent to an external device (customer) for processing. Such multiple sense operations may provide information in the form of state confidence information that can be used by the external device to correct the read-out data as necessary. For example, in the case illustrated in FIG. 3 in which the sense parameter is a threshold voltage of the memory cells of a memory to be read, multiple sense measurements may be conducted at different threshold voltages that span a range including $SP_r$ in order to provide state confidence information about the logical state of the memory elements to be read. By spanning a range of threshold voltages, the output from the multiple sense measurements may provide more reliable information to an external device, since the multiple sense measurements may span a voltage range in which the probability changes of turning on the memory cell, and thereby inducing a transition from one logical state to another. For example, if the results of a sense operation performed at a threshold voltage corresponding to point $SP_2$ are that the memory cell(s) being sensed are turned on, it can be determined with a high degree of confidence that the actual logical state of the memory cell that was sensed corresponds to "1." This conclusion follows because the sense parameter distribution 304 indicates that few, if any, memory cells set to the logical state "0" exhibit a threshold voltage as low as that corresponding to $SP_2$. Accordingly, any memory cell that changes state when the sense operation applies a voltage corresponding to $SP_2$ must have been actually written to the logical state "1." Likewise, if the results of a sense operation performed at a threshold voltage corresponding to point $SP_3$ do not result in the memory cell turning on, it can be determined with a high degree of confidence that the actual logical state of the memory sell that was sensed corresponds to "0." This conclusion follows because the sense parameter distribution 302 indicates that few, if any, memory cells set to the logical state "1" would exhibit a threshold voltage as high as that corresponding to $SP_3$. Accordingly, any memory cell that does not change state when the sense operation applies a voltage corresponding to $SP_3$ must have been actually written to the logical state "0." On the other hand, if a sense measurement performed at the threshold voltage corresponding to $SP_r$ results in the memory cell transistor turning on, the results cannot be unambiguously interpreted, since, as indicated by the overlap in the sense parameter distributions 302 and 304 in this region, some memory cells set to logical "1" and some memory cells set to logical "0" may turn on when subject to a sense voltage corresponding to $SP_r$. Thus, the results of a series of sense operations conducted over the range between $SP_2$ and $SP_3$ may be used to generate state confidence information that more accurately reflect the probability of a memory cell being read being in a given logical state.

To clarify operation of the present embodiments, it is to be noted that procedures that do not entail multistrobe reading of data are possible to generate state confidence data. For example, in order to provide such state confidence data to an external device, in principle, in a "serial" sense process, a bit of state confidence information may be generated and parsed to an external device after each sense operation of multiple sense operations. Thus, for example, for a data read procedure that comprises a set of five sense operations, a separate bit of state confidence data may be generated and parsed to the external device in five different sense cycles. Each sense cycle of such a read procedure may include operations such as charging the bitline and wordline, applying the sense pulse, sensing the data of memory cells in question, generating a bit of state confidence information, storing the bit to a local cache, and thereafter shipping the bit out to an external device for processing. For each subsequent sense operation, the bitline and wordline may be recharged to respective appropriate levels, and the next sense pulse applied at a different sense voltage, leading to generation of an additional bit of state confidence data, which is subsequently parsed to the external device, and so forth.

However, the above serial sense procedure suffers from the fact that each cycle of performing a sense operation requires that all bits from memory cells read in a first sense operation be received before bits from a new sense operation are to be parsed. For example, for simplicity it may be assumed that a NAND array page contains 1000 bits that are read in a first sense operation. In order to ship the 1000 bits from a local cache to an external device, a significant amount of time may be consumed, since the bus width may be, for example, 8 bits. Moreover, the process of charging the wordline and/or bitline between each sense operation typically consumes a significant amount of time, leading to a relatively long read time if the serial sensing procedure were to be employed to provide state confidence information.

Figure 4:
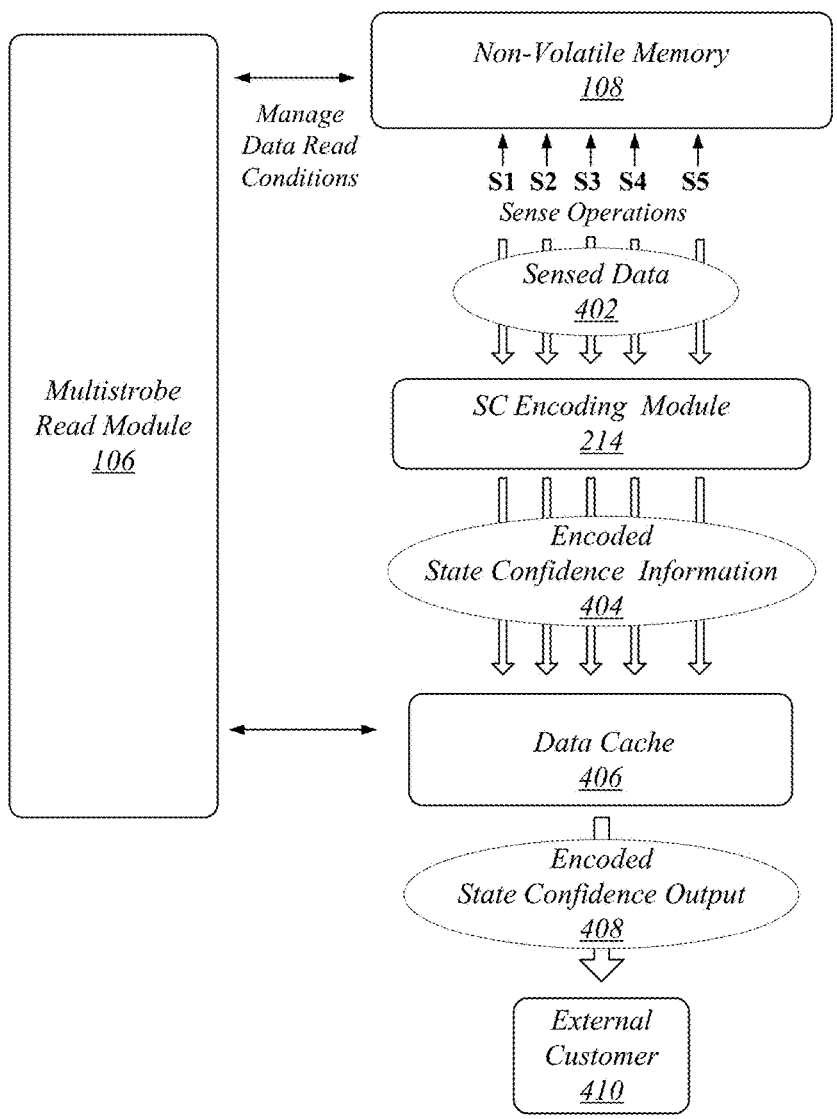
FIG. 4 depicts operation of an exemplary system arrangement.

Consistent with the present embodiments, these shortcomings are addressed in multistrobe procedures and apparatus that provide novel and efficient collection and parsing of state confidence information when multiple sense operations are performed on a memory cell. Turning now to FIG. 4 there is shown a multistrobe arrangement to provide state confidence information based upon read of a memory array using multiple sense procedures. Following the example of FIG. 3, the arrangement of FIG. 4 may be employed to read a memory array in which the distribution of different logical states may exhibit a threshold voltage overlap. In one example of the operation of the arrangement of FIG. 4, the multistrobe read module 106 may manage read conditions for data sensed from the non-volatile memory 108, which may be characterized by sense parameter distribution 302 and sense parameter distribution 304 shown in FIG. 3. In the scenario illustrated in FIG. 4, a set of five different sense operations S1, S2, S3, S4, and S5 may be applied to the non-volatile memory 108 in order to provide state confidence information regarding memory addresses (memory cells) being read in a data read operation. After each sense operation, of the five different sense operations S1, S2, S3, S4, and S5, the result of that sense operation may be individually provided to the state confidence encoding module 214. The sum of such sensed data is shown as sensed data 402. The state confidence encoding module 214, in turn, may output encoded state confidence information 404 to a data cache 406. When all sense operations S1-S5 are complete, the multistrobe read module 106 may schedule encoded state confidence output 408 to be parsed to the external device 410.

An advantage of the multistrobe data read arrangement of FIG. 4 is that data may be sensed and encoded multiple times at different sense conditions while the encoded results of the different sense conditions are parsed to the external device only at a single instance. This largely avoids problems of data bottlenecking that may result when each all the bits from each page of memory are stored to the cache and parsed to an external device after each of multiple sense operations.

In addition to the above advantages, and consistent with various embodiments, the multistrobe read module 106 may manage data read conditions during a multistrobe read operation containing multiple sense operations, such that the multiple sense operations are conducted in a more efficient manner. In some embodiments, and as detailed below, the managing of data read conditions may include monitoring and adjusting read conditions between different sense operations so that multiple sense operations are performed in a manner that reduces read time and more accurately generates state confidence bits based upon the multiple sense operations.

Continuing with the example of FIG. 4, in one embodiment, the SC encoding module 214 may encode the results of a multistrobe read operation that entails five sense operations S1-S5 as a multiple-bit encoded output. In one example, the multiple-bit encoded output may be updated after each sense operation and a final multiple-bit encoded output parsed to the external device after the final sense operation. In this manner, the size of the multiple-bit encoded output parsed to the external device may be the same as the size of the original encoded output generated after the first sense operation.

Consistent with various embodiments, the multistrobe read module 106 may adjust one or more read parameters upon one or more occasions during a multistrobe read operation in which two or more sense operations are performed. This may be accomplished by monitoring one or more read conditions and adjusting the one or more read condition as appropriate between consecutive sense operations. The term "read conditions" refers to a parameter such as wordline voltage, bitline voltage, state of a bitline discharge path, charge state of wordline/bitline, sense voltage and sense pulse duration, and so forth.

In one embodiment, the multistrobe read module 106 may determine whether the bitline discharge path is to remain enabled between consecutive sense operations. For example, in a read operation that is to perform five consecutive sense operations each under a slightly different sense condition, the bitline discharge path module 204 may determine that the bitline discharge path is to be enabled the entire time between the first and second sense operations, and may subsequently determine that the bitline discharge path is to be disabled for a portion of time between the second and third sense operations. This ability to selectively enable/disable the bitline discharge path provides flexibility to increase the accuracy of sense operations, for example, when the time between consecutive sense operations increases. In the above example, between the first and second sense operations, the read conditions may be such that the time between conducting the first sense operation and second sense operation is to be relatively shorter, so that the multistrobe read module determines that the bitline discharge path is to be/remain enabled. In contrast, the subsequent read conditions may develop such that the time between the second and third sense operations is to be relatively longer. For example, extra time may be needed to ramp the wordline between consecutive second and third sense operations, leading the bitline discharge path module 204 to determine that the bitline discharge path feature is to be disabled after the second sense operation is performed and then reenabled when ready to begin the third sense operation.

In another embodiment, the multistrobe read module 106 may employ the wordline adjustment module 210 to determine whether the wordline voltage is to be adjusted between consecutive sense operations and the value of the new wordline voltage if adjusted. This ability to selectively adjust the wordline voltage provides flexibility to increase the accuracy of a sense operation as needed, by reducing the offset between the wordline conditions for read and verify. For example, in a read operation that includes fives sense operations, after three sense operations are performed, the state of the wordline may change to the extent that the difference between the state of the wordline that existed when verifying placement of the memory cell deviates beyond a tolerable amount from the expected state of the wordline for the subsequent sense operation. The wordline adjustment module 210 may thereby determine that the wordline voltage is to be adjusted before the next sense operation and thereby enable this feature. In so doing, the wordline voltage may be reset to the desired level for the next sense operation(s).

In a further embodiment, the bitline precharge module 208 may selectively enable bitline precharge between consecutive sense operations, as well as determine the value of the new bitline precharge voltage if adjusted. The ability to selectively set whether precharge is enabled and to adjust the bitline precharge voltage provides flexibility to optimize the performance of a multistrobe sequence comprising multiple consecutive sense operations by only refilling (precharging) the bitline when conditions warrant a refill. In one example, the multistrobe read module 106 may monitor read conditions and determine that wordline voltage is to be adjusted between two consecutive sense operations. Since time is to be allocated to move the wordline voltage, the bitline precharge module 208 may ascertain that the bitline can be set to a desired precharge level between the consecutive sense operations during the wordline voltage adjust process without incurring any additional time penalty to perform the precharge process. Accordingly, on one or more occasions between one or more pairs of consecutive sense operations, the bitline precharge module 208 may enable bitline precharge. A further benefit of providing selective enabling of bitline precharge is that the offset may be reduced between bitline conditions for "read" and "verify," thereby increasing the accuracy in a sense operation.

In still another embodiment, the sense condition adjustment module 206 may selectively adjust sense conditions for one or more sense operations performed in a multistrobe read operation. This ability to selectively set sense parameters such as the sense voltage and the duration of a sense pulse provides flexibility to optimize any given sense operation to be performed, in accordance with variations in the bitline and/or wordline voltage. As a result, in various embodiments, the accuracy of data generated by a multistrobe read process may be evaluated in order to adjust sense parameters to be applied for reading a given type of non-volatile memory device, such as a flash NAND device.

Figure 5:
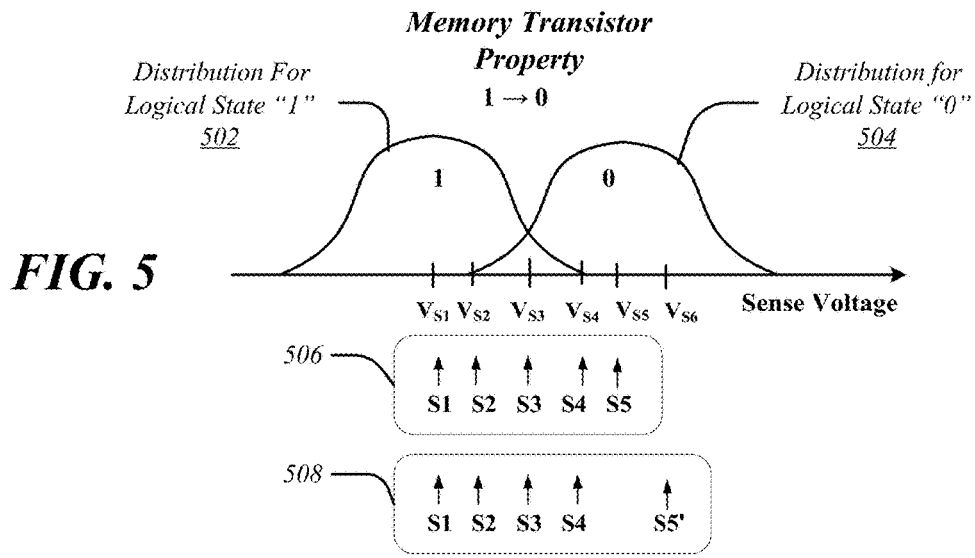
FIG. 5 depicts another example of memory properties.
Figure 6:
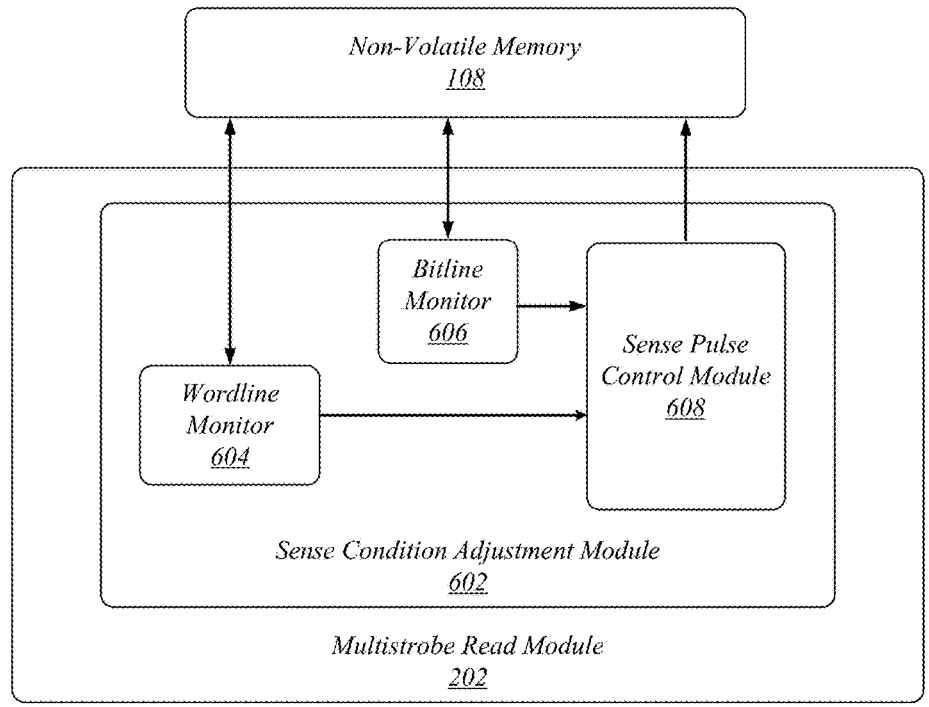
FIG. 6 depicts an exemplary system for reading the memory of FIG. 5.

In order to illustrate this feature, FIGS. 5 and 6 show one scenario in which sense conditions in a multistrobe read operation are adjusted. FIG. 5, in particular, depicts two different threshold voltage distributions associated with transistors of memory cells set to respective logical states "1" and "0" of a memory array, which may be included in the non-volatile memory 108. As shown, a first threshold voltage distribution 502 represents the logical state "1" and a second threshold voltage distribution 504 represents the logical state "0." As is evident, the threshold voltage distribution 502 overlaps the threshold voltage distribution 504. In the scenario depicted in FIG. 5, in order to provide state confidence information, a multistrobe data read operation may be set to perform a set 506 of five sense operations S1, S2, S3, S4, and S5 at respective sense voltages $V_{S1}$, $V_{S2}$, $V_{S3}$, $V_{S4}$, and $V_{S5}$.

Turning now to FIG. 6, there is shown an exemplary block diagram of a sense condition adjustment module 602, which may be used to selectively change sense conditions employed in a multistrobe data read performed on the non-volatile memory 108. The sense condition adjustment module may adjust sense conditions in one or more sense operations by monitoring bitline/wordline conditions during a data read and setting the appropriate sense condition based on the monitored conditions.

The sense condition adjustment module 602 may include a wordline monitor 604, bitline monitor 606, and sense pulse control module 608. The wordline monitor 604 may monitor wordline conditions in select wordline(s) of the non-volatile memory 108, for example, at various instances during a data read operation. Similarly, the bitline monitor 606 may monitor bitline conditions in select bitlines of the non-volatile memory 108 during the data read operation. The wordline monitor 604 and bitline monitor 606 may transmit signals indicating the respective wordline and/or bitline voltage to the sense pulse control module 608, which may then alter sense conditions for one or more subsequent sense operations to be performed in non-volatile memory 108.

In the scenario depicted in FIG. 5, after one or more sense operations S1-S4 are performed at the respective sense voltages $V_{S1}$, $V_{S2}$, $V_{S3}$, $V_{S4}$, the wordline and/or bitline voltage of the memory elements being read may change, and the accumulated inaccuracies of the sense operations after a second sense operation or later sense operation may result in a sense voltage to effectively drift from a preset value. As illustrated, in FIG. 5, for example, the sense voltage of sense operation S5 may shift to a higher level corresponding to $V_{S6}$ in response to a shift in wordline voltage, resulting in an adjusted set 504 of sense operations, that may represent the actual conditions of the sense operations performed during one or more sense operation performed after an initial sense operation. As a result, the sense pulse control module 508 may adjust the wordline voltage, the duration of sense pulse (sense time) or another read parameter to compensate for the observed shift to $V_{S6}$ and thereby adjust a subsequent sense operation so that the actual sense voltage is in line with the target voltage, that is $V_{S5}$. The result of this process may be that the procedure for application of a set of read parameters for multistrobe read of a NAND device are tuned to minimize error in actual sense voltage applied during multiple sense operations.

In other embodiments, the duration of one or more sense pulses in a multistrobe read operation may be adjusted according to wordline and/or bitline voltage conditions. Following the example of FIG. 5, instead of adjusting voltage in sense operation S5 to compensate for a shift in wordline and/or bitline voltage, the duration of the sense pulse for operation S5 may be changed from an original duration to an adjusted duration in a manner that is expected to approximate read conditions were the sense pulse of original duration applied under the original wordline/bitline voltage conditions. For example, in typical operation, the difference in bitline voltage level that may be sensed by a sense amp between that produced by a memory cell set to a logical "1" and a memory cell set to a logical "0" increases with sense time. Accordingly, the duration of the sense pulse of sense operation S5 may be increased in certain cases to compensate for changed wordline/bitline voltage conditions.

In still other embodiments, the wordline/bitline (WL/BL) charge module 212 may monitor wordline and/or bitline charge state during a multistrobe read operation, and determine whether to charge the wordline and/or bitline between consecutive sense operations based upon the results of the monitoring. For example, the WL/BL charge module 212 may schedule a new sense operation to succeed a prior sense operation of the multiplicity of sense operations without recharge of the wordline as long as the value of the wordline voltage and/or bitline voltage remain within preset ranges. Thus, in a five-sense-operation multistrobe read process, the wordline and/or bitline may be charged as few as one time each depending on their respective states after each succeeding sense operation.

Figure 7A:
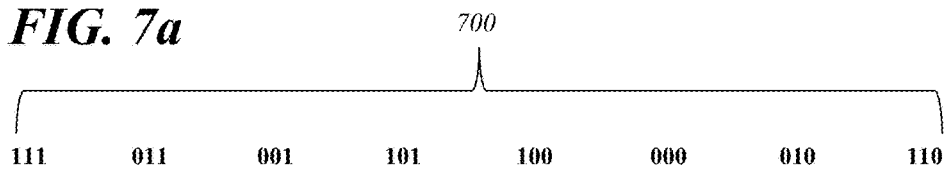
FIG. 7a depicts an example of data storage in a multilevel memory.

In various additional embodiments, multistrobe read operations may be performed to generate state confidence information from memories containing multiple level cell (MLC) memory cells in which multiple bits are stored in each cell. In known MLC technology, a different threshold voltage may be set for each different logical state. As discussed above, in a memory array having multiple memory cells the threshold voltage associated with a given logical state may be characterized by a distribution of voltages, because the threshold voltage of individual memory cells may deviate from the nominal threshold voltage. The same applies to MLC-based arrays, where threshold voltage representing a given logical state is characterized by a distribution of voltage. FIG. 7a depicts an example of data storage in a three-bit MLC in which a set 700 of one possible arrangement of eight three-bit combinations is illustrated. However, other arrangements are possible. In particular, in order from lowest threshold voltage to highest, the different sequences are (1,1,1); (0,1,1); (0,0,1); 1,0,1); (1,0,0); (0,0,0); (0,1,0); (1,1,0).

Figure 7B:
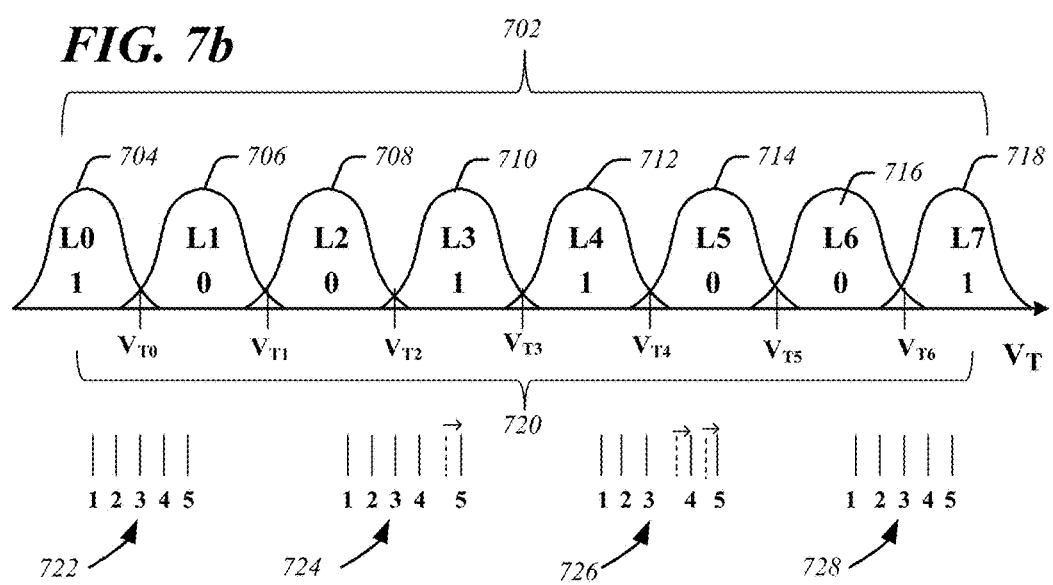

Turning now to FIG. 7b, there is shown a set 702 of threshold voltage distributions that may be used to represent the eight different 3-bit logical state sequences that may be stored in the 3-bit MLC. In particular, the sequences (1,1,1);

(0,1,1); (0,0,1); (1,0,1); (1,0,0); (0,0,0); (0,1,0); (1,1,0) may be stored in the respective threshold voltage distributions 704, 706, 708, 710, 712, 714, 716, 718, which correspond to the levels L0, L1, L2, L3, L4, L5, L6, and L7, as shown. In general, in order to determine a logical state of a bit of data in the memory cell represented by the distributions 704-718 of FIG. 7*b*, sensing may be applied at a sense voltage represented by $V_{T0}$ to $V_{T6}$ as shown. To illustrate this point, each threshold voltage distribution in FIG. 7*b* also depicts the logical state of the first bit of the three-bit logical state sequence corresponding to that voltage distribution. In order of increasing threshold voltage, the first bits read as "1," "0," "0," "1," "1," "0," "0," "1." This exemplary sequence is useful to minimize the amount of data sense operations required to determine the logical state of the bit being read. For example, if it is desired to read out only the logical state of the first bit without state confidence information, a series of four sense operations may be applied at threshold voltages $V_{T0}$, $V_{T2}$, $V_{T4}$, and $V_{T6}$. These threshold voltages mark the transition between a logical "0" and logical "1" or logical "1" and logical "0" in the first bit, as illustrated in FIG. 7*b*. Accordingly, when the transistor of the memory cell turns on in response to one of the threshold voltages $V_{T0}$, $V_{T2}$, $V_{T4}$, and $V_{T6}$ the bit state of that cell is known.

In a similar fashion, the bit states of the second and third bits can be probed. For example, in order of increasing threshold voltage, the second bits read as "1," "1," "0," "0," "0," "0," "1," "1." In this case if it is also desired to read out only the logical state of the second bit without state confidence information, a series of only two sense operations need be applied at threshold voltages $V_{T1}$ and $V_{T5}$ because these threshold voltages mark the only transition between a logical "0" and logical "1" or logical "1" and logical "0" for the sequence of second bits. For the third bit, whose pattern reads as "1," "1," "1," "1," "0," "0," "0," "0," only one sense operation need be applied at threshold voltage $V_{T3}$ because this threshold voltage marks the only transition between a logical "0" and logical "1" or logical "1" and logical "0" for the third bit sequence.

Figure 8:
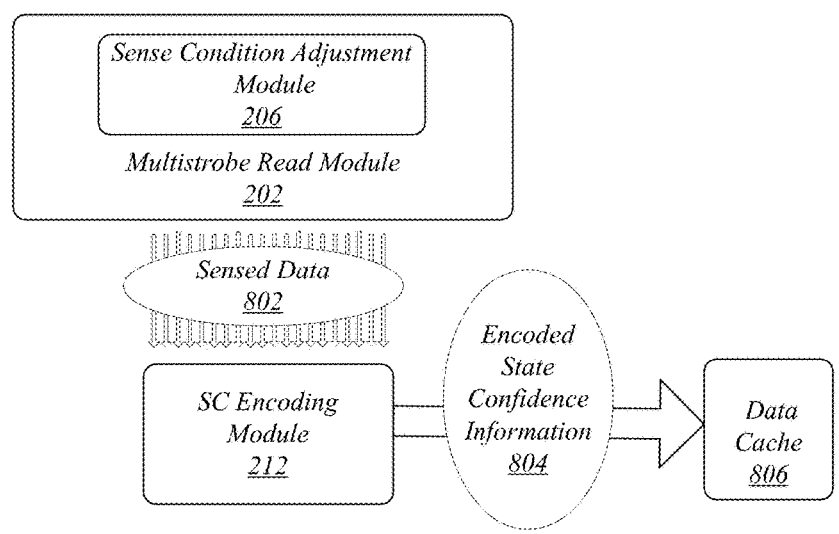
FIG. 8 depicts operation of an exemplary system for reading a memory.

Referring also to FIG. 8, there is shown an example of managing multiple sense operations in a multistrobe read process. As illustrated the multistrobe read module 202 is employed to sense, encode, and store state confidence information from a three-bit MLC characterized by the threshold voltage distributions of FIG. 7*b*. In particular, the multistrobe read module 202 may direct a series of sense operations to be performed about a set of target threshold voltages that is selected for sensing the appropriate bit of the three-bit MLC memory to be read. In the particular example shown in FIG. 7*b*, the state confidence information from the first bit is probed by performing a set of five sense operations about each of the threshold voltages $V_{T0}$, $V_{T2}$, $V_{T4}$, and $V_{T6}$. In this manner, by performing the four sets of sense operations 722, 724, 726, and 728, the logical state of the first bit of the three-bit MLC can be determined together with state confidence data that indicates the reliability of that determination. As further illustrated in FIG. 7*b*, for example, if the transistor of the three-bit memory cell turns on in response to the sense operation 726-2, it may be determined that the logical state of the first bit is "1" because, according to the threshold voltage distribution 712, most transistors in the memory cell representing 3-bit logical state "1,0,0" would turn on in response to application of the threshold voltage corresponding to the sense operation 726-2, while, according to the threshold voltage distribution 714, most transistors in the memory cell representing 3-bit logical state "0,0,0" would not turn on in response to application of the threshold voltage corresponding to the sense operation 726-2.

Consistent with various embodiments, the multistrobe read module 202 may adjust the read conditions during the multiple sense operations, as suggested by FIG. 7*b*. In one example, the set of sense operations may be performed in the order 722, 724, 726, and 728. FIG. 7*b* illustrates examples in which the sense condition adjustment module 206 may adjust sense conditions between consecutive sense operations during the multistrobe read process. For example, to efficiently perform the multiple sets of sense operations 722-728, the multistrobe read module 202 may allocate wordline recharging only when necessary. In one example, a first wordline recharge may take place after the set of five sense operations 722 have been performed. During the next set of sense operations voltage of sense operations 724, after a series of sense operations, at the sense operation 724-5, the wordline voltage may be observed to deviate from an originally set value (dashed line) to a higher voltage (solid line), as shown in FIG. 7*b*. Accordingly, the sense voltage may be adjusted by the sense condition adjustment module 206 for subsequent sense operations in a manner to bring overall sense conditions into accordance with desired sense conditions. The wordline may be subsequently recharged and a new set of sense operations 726 performed. Again, during the performing of the sense operations 726, the wordline voltage may shift to the extent that the sense voltage is again adjusted by the sense condition adjustment module 206 for subsequent sense operations in a manner to bring overall sense conditions into accordance with desired sense conditions.

As further illustrated in FIG. 8, the sensed data 802 may be encoded by the state confidence encoding module 214, and provided as encoded state confidence information 804 in the data cache 806. In some embodiments, the encoded state confidence information may comprise a set of bits that may be updated after each sense operation. The updated set of bits may be held in the data cache 734 until multistrobe read module schedules the parsing of data to an external device after all sense operations 722-728 are complete. In a multistrobe read process applied to an MLC flash NAND memory, the process illustrated in FIGS. 7*a*-7*c* may be carried out on each bit of a page being read, which may extend up to many thousands of bits in some embodiments. In this manner, state confidence information for an MLC memory may be obtained in a flexible manner that more accurately senses each bit in a memory array, more efficiently encodes sensed data, stores encoded information, and more efficiently delivers the encoded information to an external device.

Included herein is a set of flow charts representative of exemplary methodologies for performing novel aspects of the disclosed architecture. While, for purposes of simplicity of explanation, the one or more methodologies shown herein, for example, in the form of a flow chart or flow diagram, are shown and described as a series of acts, it is to be understood and appreciated that the methodologies are not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

Figure 9:
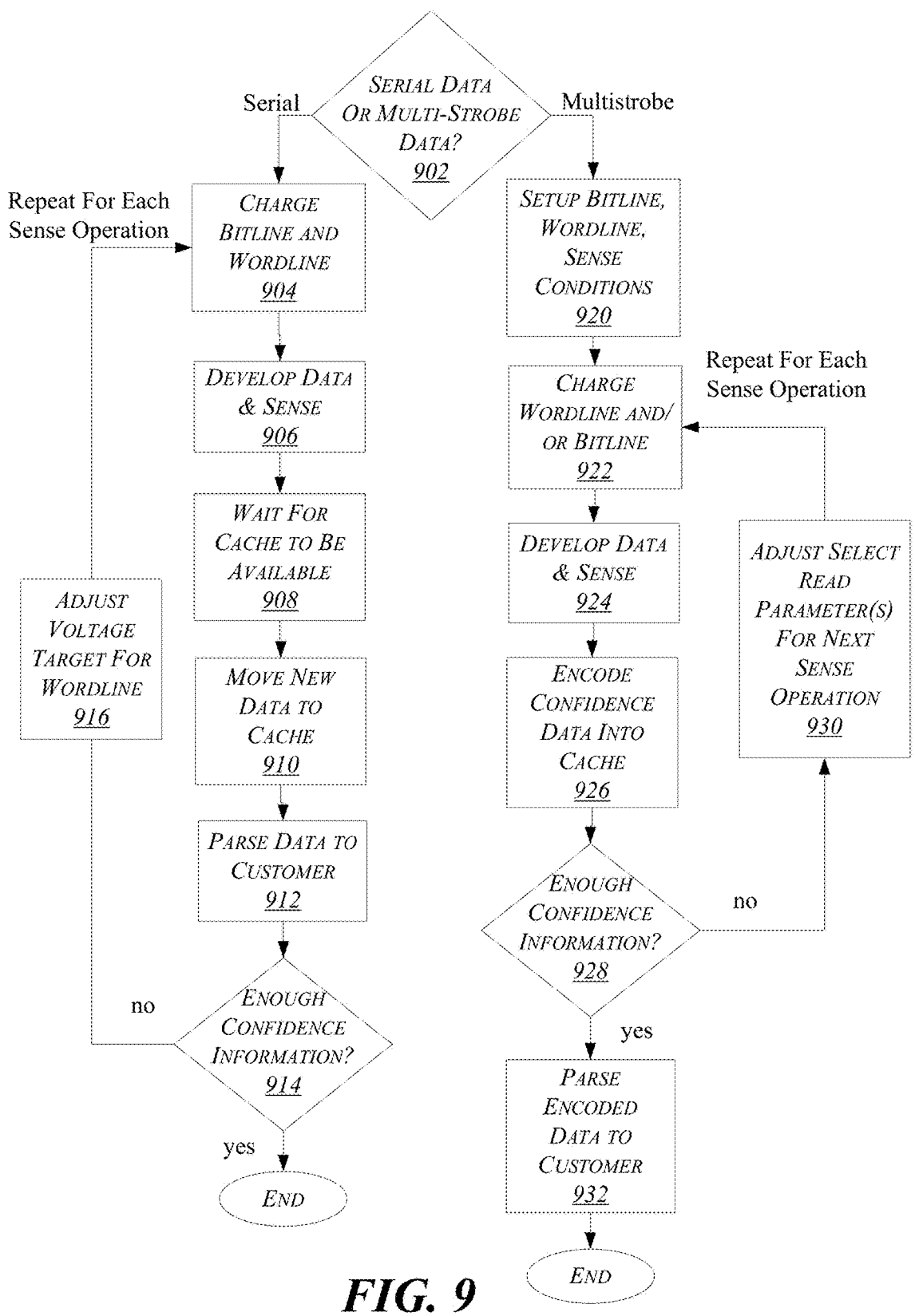
FIG. 9 presents an exemplary first logic flow.

FIG. 9 depicts an exemplary first logic flow 900. At block 902, a determination is made as to whether serial data read or multistrobe data read is to be performed. For example, for reading of different parts of a memory, for some data it may be desirable to encode data for processing by an LDPC engine, while other data may not require such error correction. If state confidence data is to be generated and a serial read process is chosen, the flow moves to block 904. At block 906 the data for the memory read for a given sense operation is developed and sensed. At block 908, the data is held while waiting for a cache to become available. At block 910, the new data is moved to a cache, while at block 912 data is parsed to an external device.

If, at block 914, no more confidence information is needed, the flow ends. Otherwise, the flow moves to block 916, where the voltage target for the wordline is adjusted. Subsequently, the flow returns to block 904 where the wordline and bitline are charged. The loop between blocks 904 and 916 may be repeated for each data sense operation.

If, at block 902, multistrobe read is selected, the flow moves to block 920, where the initial sense conditions, wordline and bitline conditions may be set. The flow then moves to block 922 where the wordline and bitline charged. The flow then moves to block 924, where the data is developed and sensed. At block 926 confidence data is encoded into a cache based on the sensed data. In some embodiments, this encoded confidence data may be in the form of multiple bits. At block 928, if enough confidence information has been obtained, the flow moves to block 932 where the encoded confidence data is parsed out to an external device (customer).

If at block 928, more confidence information is to be generated, the flow moves to block 930, where select read parameters may be adjusted for the next read operation. The flow then returns to block 922, where the wordline and bitline are charged if necessary. In this manner, the loop described by the sequence of blocks 922-930 may be performed for each data sense operation, without necessarily engendering charging of the wordline or bitline between each sense operation, and without parsing data to an external device until all sense operations to be performed are complete. In one example according to the logic flow 900, a multistrobe read process may entail seven read operations for which as few as one wordline charging operation is performed. Moreover, the multistrobe read process may generate a concise encoded output that is updated after each sense operation, thereby providing a more efficient manner to capture state confidence information than in a serial sense procedure.

Figure 10:
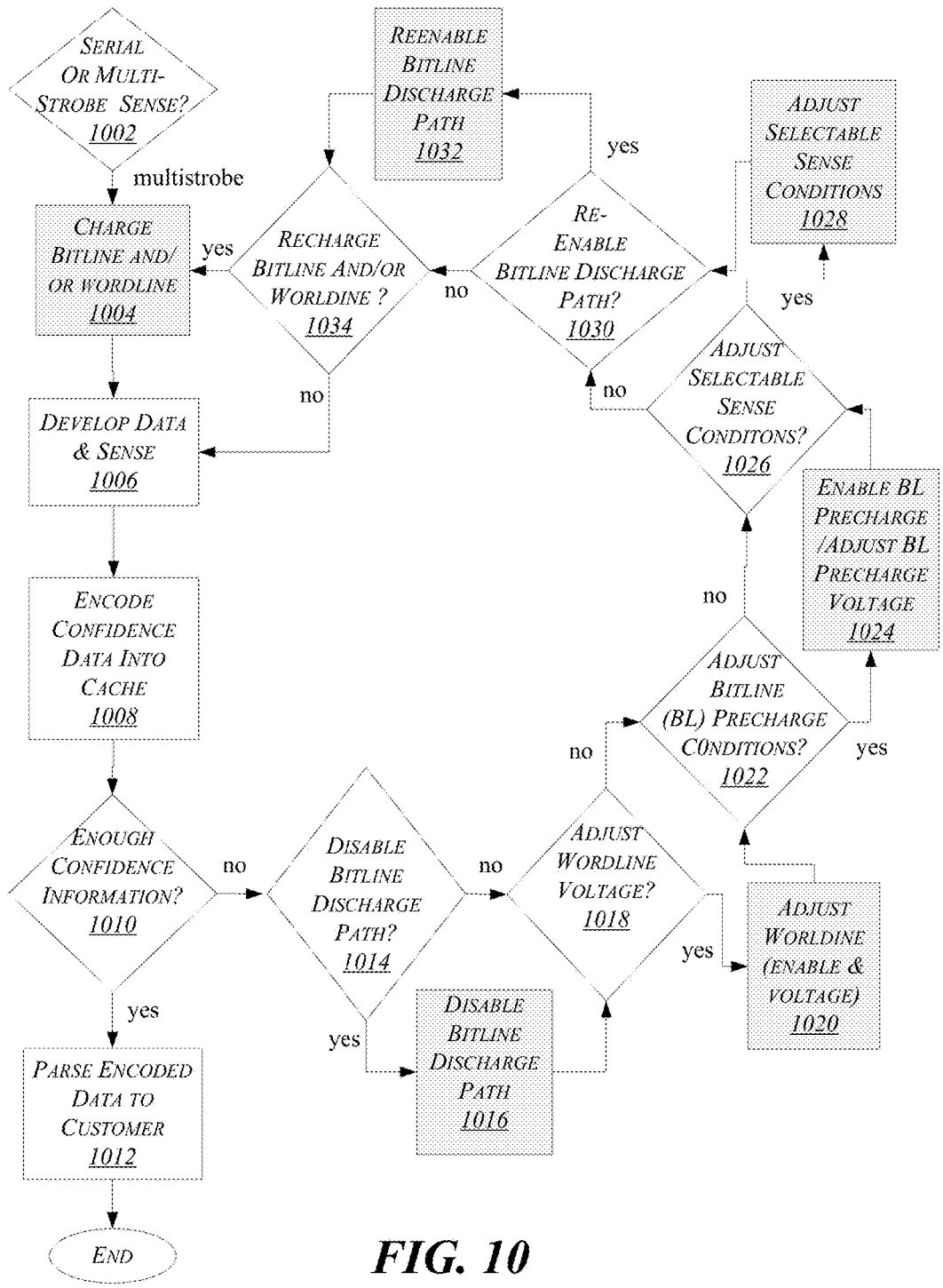
FIG. 10 presents an exemplary second logic flow.

FIG. 10 depicts an exemplary second logic flow 1000. The logic flow 1000 may represent a portion of the logic flow 900. At block 1002, a determination may be made that multistrobe read process is to be employed for reading data from a non-volatile memory. At block 1004, the bitline and wordline are charged. At block 1006, the data is developed and sensed for a first sense operation. At block 1008, confidence data is encoded into a cache based upon the sensed data. At block 1010, if enough confidence information has been obtained, the flow moves to block 1012, where data is parsed to an external device.

If, at block 1010, it is determined that more confidence information is to be provided, the flow moves to a block 1014. At block 1014, and succeeding blocks, a series of decisions are made as to whether one or more parameters associated with a data read are to be adjusted. As noted above, the present embodiments are not limited to the specific sequence illustrated in the FIG. 10, which is merely exemplary. At block 1014, a decision is made as to whether a bitline discharge path is to be disabled. If so, the flow moves to block 1016, where the bitline discharge path is disabled, and thence to block 1018. The decision whether to disable the discharge path may be based upon one or more factors, such as whether voltage on the wordline is to be ramped before a next sense operation, and the current state of the discharge path, that is, whether the discharge path is presently enabled or not. If not, the flow moves directly to block 1018.

At block 1018, a decision is made as to whether the wordline voltage is to be adjusted. If so, the flow moves to block 1020, where the voltage on the wordline is changed from a present level, and thence to block 1022. The decision to adjust wordline voltage may be based upon whether a difference between expected wordline voltage for the subsequent sense operation and the wordline voltage present when verifying placement of a cell exceeds a threshold. If wordline voltage is not to be adjusted, the flow moves directly to block 1022.

At block 1022, a decision is made as to bitline discharge conditions are to be adjusted. If so, the flow moves to block 1024, where the bitline precharge is enabled and the appropriate adjustment on bitline precharge is performed, and thence to block 1026. The decision to perform bitline precharge may be based upon one or more factors including whether wordline voltage is to be adjusted before the next sense operation. If bitline precharge is not to be enabled, the flow moves directly to block 1026.

At block 1026, a decision is made as to whether selectable sense conditions are to be adjusted. The selectable sense conditions may include the sense voltage and duration of sense pulse to be applied in the next sense operation. If so, the flow moves to block 1028, where one or more sense conditions are adjusted from their present state, and thence to block 1030. The decision to adjust the selectable sense conditions may be based upon factors including the present bitline voltage, present wordline voltage, and other factors. For example, sense voltage and/or sense pulse duration for the next sense operation may be increased from a previous value applied in a prior sense operation to adjust for a change in the bitline voltage or a change in wordline voltage during the multistrobe read operation. If selectable sense conditions are not to be changed, the flow moves directly to block 1030.

At block 1030, a decision is made as to whether a bitline discharge path is to be re-enabled. For example, if the bitline discharge path was temporarily disabled after the prior sense operation, the bitline discharge path is then re-enabled at block 1032, and the flow moves subsequently to block 1034. If the bitline discharge path was not disabled, then re-enabling is not necessary for the subsequent sense operation, and the flow moves directly to block 1034.

At block 1034, a decision is made as to whether the bitline and/or wordline are to be recharged. If so, the flow returns to block 1004, where the bitline and/or wordline are (re) charged. The decision to recharge the bitline/wordline may be based upon the state of one or more read conditions, such as the present state of the bitline voltage and the wordline voltage. These read conditions, in turn, may depend upon prior flow sequence in the logic flow 1000. For example, if the wordline voltage is previously adjusted, as at block 1020, it will need to be recharged in block 1004. Similarly, if the bitline is precharged and/or the bitline precharge voltage is adjusted, as at block 1024, then the bitline recharge operation at block 1034 should be scheduled.

However, in cases where it is not necessary to recharge the wordline, it may be desirable not to recharge the wordline until the deviation in the present wordline voltage from an original value set at the beginning of the multistrobe read operation has exceeded a threshold. The threshold may represent a wordline voltage expected to compromise accuracy of a next sense operation even accounting for available adjustments to other parameters, including sense voltage and sense pulse duration. Thus, as long as the wordline voltage remains within a preset range that does not exceed that threshold, it may be preferable to adjust other read parameters without adjusting wordline voltage in order to avoid the time penalty incurred with charging the wordline.

If the decision is not to charge the wordline/bitline at block 1034, the flow returns to block 1006, where a next sense operation is performed, that is, the data are developed and sensed for the memory cell being read, without an adjustment in WL or BL voltage.

FIG. 11 illustrates an embodiment of an exemplary computing architecture 1100 suitable for implementing various embodiments as previously described. As used in this application, the terms "system" and "component" are intended to refer to a computer-related entity, either hardware, a combination of hardware and software, software, or software in execution, examples of which are provided by the exemplary computing architecture 1100. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

In one embodiment, the computing architecture 1100 may comprise or be implemented as part of an electronic device. Examples of an electronic device may include without limitation a mobile device, a personal digital assistant, a mobile computing device, a smart phone, a cellular telephone, a handset, a one-way pager, a two-way pager, a messaging device, a computer, a personal computer (PC), a desktop computer, a laptop computer, a notebook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, television, digital television, set top box, wireless access point, base station, subscriber station, mobile subscriber center, radio network controller, router, hub, gateway, bridge, switch, machine, or combination thereof. The embodiments are not limited in this context.

The computing architecture 1100 includes various common computing elements, such as one or more processors, co-processors, memory units, chipsets, controllers, peripherals, interfaces, oscillators, timing devices, video cards, audio cards, multimedia input/output (I/O) components, and so forth. The embodiments, however, are not limited to implementation by the computing architecture 1100.

As shown in FIG. 11, the computing architecture 1100 comprises a processing unit 1104, a system memory 1106 and a system bus 1108. The processing unit 1104 can be any of various commercially available processors. Dual microprocessors and other multi-processor architectures may also be employed as the processing unit 1104. The system bus 1108 provides an interface for system components including, but not limited to, the system memory 1106 to the processing unit 1104. The system bus 1108 can be any of several types of bus structure that may further interconnect to a memory bus (with or without a memory controller), a peripheral bus, and a local bus using any of a variety of commercially available bus architectures.

The computing architecture 1100 may comprise or implement various articles of manufacture. An article of manufacture may comprise a computer-readable storage medium to store logic. Embodiments may also be at least partly implemented as instructions contained in or on a non-transitory computer-readable medium, which may be read and executed by one or more processors to enable performance of the operations described herein. Examples of a computer-readable storage medium may include any tangible media capable of storing electronic data, including volatile memory or non-volatile memory, removable or non-removable memory, erasable or non-erasable memory, writeable or re-writeable memory, and so forth. Examples of logic may include executable computer program instructions implemented using any suitable type of code, such as source code, compiled code, interpreted code, executable code, static code, dynamic code, object-oriented code, visual code, and the like.

The system memory 1106 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. In the illustrated embodiment shown in FIG. 11, the system memory 1106 can include non-volatile memory 1110 and/or volatile memory 1112. A basic input/output system (BIOS) can be stored in the non-volatile memory 1110.

The computer 1102 may include various types of computer-readable storage media in the form of one or more lower speed memory units, including an internal hard disk drive (HDD) 1114, a magnetic floppy disk drive (FDD) 1116 to read from or write to a removable magnetic disk 1118, an optical disk drive 1120 to read from or write to a removable optical disk 1122 (e.g., a CD-ROM or DVD), and a solid state drive (SSD) 1123 to read or write data to/from a non-volatile memory (NVM) 1125, which may include a NAND flash memory and NAND controller as described herein. The NVM 1125 may include a phase change memory (PCM), a spin memory, phase change memory with switch (PCMS), magnetoresistive random access memory (MRAM), spin memory, nanowire memory, ferroelectric transistor random access memory (FeTRAM). The HDD 1114, FDD 1116, optical disk drive 1120, and solid state drive 1123 can be connected to the system bus 1108 by a HDD interface 1124, an FDD interface 1126, an optical drive interface 1128, and a solid state drive interface 1129, respectively. The HDD interface 1124 for external drive implementations can include at least one or both of Universal Serial Bus (USB) and IEEE 1394 interface technologies. The solid state drive interface 1129 may comprise any suitable interface for coupling to the host device, such as, for example, but not limited to, a serial advanced technology attachment (SATA) interface, a serial attached SCSI (SAS) interface, a universal serial bus (USB) interface, a peripheral control interface (PCI), or other suitable device interface The drives and associated computer-readable media provide volatile and/or nonvolatile storage of data, data structures, computer-executable instructions, and so forth. For example, a number of program modules can be stored in the drives and memory units 1110, 1112, including an operating system 1130, one or more application programs 1132, other program modules 1134, and program data 1136.

A user can enter commands and information into the computer 1102 through one or more wire/wireless input devices, for example, a keyboard 1138 and a pointing device, such as a mouse 1140. Other input devices may include a microphone, an infra-red (IR) remote control, a joystick, a game pad, a stylus pen, touch screen, or the like. These and other input devices are often connected to the processing unit 1104 through an input device interface 1142 that is coupled to the system bus 1108, but can be connected by other interfaces such as a parallel port, IEEE 1394 serial port, a game port, a USB port, an IR interface, and so forth.

A monitor 1144 or other type of display device is also connected to the system bus 1108 via an interface, such as a video adaptor 1146. In addition to the monitor 1144, a computer typically includes other peripheral output devices, such as speakers, printers, and so forth.

The computer 1102 may operate in a networked environment using logical connections via wire and/or wireless communications to one or more remote computers, such as a remote computer 1148. The remote computer 1148 can be a workstation, a server computer, a router, a personal computer, portable computer, microprocessor-based entertainment appliance, a peer device or other common network node, and typically includes many or all of the elements described relative to the computer 1102, although, for purposes of brevity, only a memory/storage device 1150 is illustrated. The logical connections depicted include wire/wireless connectivity to a local area network (LAN) 1152 and/or larger networks, for example, a wide area network (WAN) 1154. Such LAN and WAN networking environments are commonplace in offices and companies, and facilitate enterprise-wide computer networks, such as intranets, all of which may connect to a global communications network, for example, the Internet.

When used in a LAN networking environment, the computer 1102 is connected to the LAN 1152 through a wire and/or wireless communication network interface or adaptor 1156. The adaptor 1156 can facilitate wire and/or wireless communications to the LAN 1152, which may also include a wireless access point disposed thereon for communicating with the wireless functionality of the adaptor 1156.

When used in a WAN networking environment, the computer 1102 can include a modem 1158, or is connected to a communications server on the WAN 1154, or has other means for establishing communications over the WAN 1154, such as by way of the Internet. The modem 1158, which can be internal or external and a wire and/or wireless device, connects to the system bus 1108 via the input device interface 1142. In a networked environment, program modules depicted relative to the computer 1102, or portions thereof, can be stored in the remote memory/storage device 1150. It will be appreciated that the network connections shown are exemplary and other means of establishing a communications link between the computers can be used.

The computer 1102 is operable to communicate with wire and wireless devices or entities using the IEEE 802 family of standards, such as wireless devices operatively disposed in wireless communication (e.g., IEEE 802.11 over-the-air modulation techniques) with, for example, a printer, scanner, desktop and/or portable computer, personal digital assistant (PDA), communications satellite, any piece of equipment or location associated with a wirelessly detectable tag (e.g., a kiosk, news stand, restroom), and telephone. This includes at least Wi-Fi (or Wireless Fidelity), WiMax, and Bluetooth™ wireless technologies. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Some embodiments may be described using the expression "one embodiment" or "an embodiment" along with their derivatives. These terms mean that a particular feature, structure, or characteristic described in connection with the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

In one embodiment, an apparatus may include a processor circuit to retrieve data from a non-volatile memory and a multistrobe read module operable on the processor circuit to set a read operation to read a memory cell over a multiplicity of sense operations, each sense operation to be performed under a different sense condition. The multistrobe read module may be further operable to schedule a new sense operation to succeed a prior sense operation of the multiplicity of sense operations without recharge of the wordline when a value of one or more read condition is within a preset range.

In another embodiment, the multistrobe read module may be operable to selectively adjust one or more read parameters to be applied to read data from the non-volatile memory based upon an error rate of data read by performing the multiplicity of read operations, the one or more read parameters including state of a bitline discharge path of the non-volatile memory, wordline voltage level of a wordline to read the memory cell of the non-volatile memory, and pre charge level of the bitline.

Alternatively, or in addition, in another embodiment, the multistrobe read module may be operable on the processor circuit to send results of the multiplicity of sense operations for storing as encoded state confidence data; and schedule the stored encoded state confidence data to be sent to an external device only after completion of the multiplicity of sense operations.

Alternatively, or in addition, in another embodiment, the multistrobe read module may be operable on the processor circuit to disable the bitline discharge path when a duration of ramping of the wordline between consecutive sense operations exceeds a first threshold.

Alternatively, or in addition, in another embodiment, the multistrobe read module may be operable on the processor circuit to adjust wordline voltage when a difference between a state of the word line that existed when verifying placement of the memory cell and an expected state of the word line for a subsequent read operation exceeds a second threshold.

Alternatively, or in addition, in another embodiment, the multistrobe read module may be operable on the processor circuit to direct the precharge level of the bitline to be adjusted and the bitline refilled when time allocated to adjust wordline voltage between a first sense operation and a next sense operation exceeds a third threshold.

Alternatively, or in addition, in another embodiment, the multistrobe read module may be operable on the controller to direct the precharge level of the bitline to be adjusted and the bitline refilled between a first sense operation and a next sense operation when an offset between bitline read and bitline verify conditions exceeds a fourth threshold.

Alternatively, or in addition, in another embodiment, the multistrobe read module may be operable on the processor circuit to adjust, when a variation in bitline voltage during the read operation exceeds a fifth threshold, one or more of a value of a reference voltage to be used during a sense pulse of a sense operation, and a duration of the sense pulse.

Alternatively, or in addition, in another embodiment, the multistrobe read module may be operable on the processor circuit to adjust one or more of a value of a reference voltage to be used during a sense pulse of a sense operation, and a duration of the sense pulse when a variation in wordline voltage during the read operation exceeds a sixth threshold.

Alternatively, or in addition, in another embodiment, the apparatus may comprise a digital display to present results of data read from the non-volatile memory.

In another embodiment, a computer implemented method may include performing a multistrobe read operation that comprises setting a read operation to read a memory cell over a multiplicity of sense operations, each sense operation to be performed under a different sense condition, and comprises scheduling a new sense operation to succeed a prior sense operation of the multiplicity of sense operations without recharge of the wordline when a value of one or more read condition is within a preset range.

In another embodiment, the computer implemented method may include selectively adjusting one or more read parameters to be applied to read data from the non-volatile memory based upon an error rate of data read by performing the multiplicity of read operations, the one or more read parameters including state of a bitline discharge path of the non-volatile memory, wordline voltage level of a wordline to read the memory cell of the non-volatile memory, and pre charge level of the bitline.

Alternatively, or in addition, in another embodiment, the computer implemented method may include sending the results of the multiplicity of sense operations for storing as encoded state confidence data, each sense condition comprising a combination of sense voltage and sense pulse duration, and scheduling the stored encoded state confidence data to be sent to an external device only after completion of the multiplicity of sense operations.

Alternatively, or in addition, in another embodiment, the computer implemented method may include disabling the bitline discharge path when a duration of ramping of the wordline between consecutive sense operations exceeds a first threshold.

Alternatively, or in addition, in another embodiment, the computer implemented method may include adjusting wordline voltage when a difference between a state of the word line that existed when verifying placement of the memory cell and an expected state of the word line for a subsequent read operation exceeds a second threshold.

Alternatively, or in addition, in another embodiment, the computer implemented method may include directing the precharge level of the bitline to be adjusted and the bitline to be refilled when time allocated to adjust wordline voltage between a first sense operation and a next sense operation exceeds a third threshold.

Alternatively, or in addition, in another embodiment, the computer implemented method may include directing the precharge level of the bitline to be adjusted and the bitline refilled between a first sense operation and a next sense operation when an offset between bitline read and bitline verify conditions exceeds a fourth threshold.

Alternatively, or in addition, in another embodiment, the computer implemented method may include adjusting one or more of a value of a reference voltage to be used during a sense pulse of a sense operation, and a duration of the sense pulse when a variation in wordline voltage during the read operation exceeds a fifth threshold.

Alternatively, or in addition, in another embodiment, an apparatus may comprise a means for performing the method of any one of the preceding embodiments.

Alternatively, or in addition, in another embodiment, at least one machine readable medium may include a plurality of instructions that in response to being executed on a computing device, cause the computing device to carry out a method according to any one of the preceding embodiments.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What has been described above includes examples of the disclosed architecture. It is, of course, not possible to describe every conceivable combination of components and/or methodologies, but one of ordinary skill in the art may recognize that many further combinations and permutations are possible. Accordingly, the novel architecture is intended to embrace all such alterations, modifications and variations that fall within the spirit and scope of the appended claims.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Some embodiments may be implemented, for example, using a computer-readable medium or article which may store an instruction or a set of instructions that, if executed by a computer, may cause the computer to perform a method and/or operations in accordance with the embodiments. Such a computer may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a processor circuit to retrieve data from a non-volatile memory; and
a multistrobe read module operable on the processor circuit to:
set a read operation to read a memory cell over a multiplicity of sense operations, each sense operation of the multiplicity of sense operations performed under a different sense condition, the memory cell comprising a wordline;
determine a state of the read operation subsequent a current sense operation;
determine whether the state of the read operation subsequent the current sense operation is within a preset range; and
schedule a next sense operation to succeed the current sense operation of the multiplicity of sense operations without recharge of the wordline based on a determination that the state of the read operation is within the preset range, and with recharge of the wordline based on a determination that the state of the read operation is not within the preset range.

2. The apparatus of claim 1, the multistrobe read module operable to selectively adjust one or more read parameters to be applied to read data from the memory cell based upon an error rate of data read by performing the multiplicity of sense operations, the one or more read parameters including state of a bitline discharge path of the non-volatile memory, wordline voltage level of a wordline to read the memory cell of the non-volatile memory, and precharge level of the bitline.

3. The apparatus of claim 2, the multistrobe read module operable on the processor circuit to:
send results of the multiplicity of sense operations for storing as encoded state confidence data; and
schedule the stored encoded state confidence data to be sent to an external device only after completion of the multiplicity of sense operations.

4. The apparatus of claim 2, the multistrobe read module operable on the processor circuit to disable the bitline discharge path when a duration of ramping of the wordline between consecutive sense operations exceeds a first threshold.

5. The apparatus of claim 2, the multistrobe read module operable on the processor circuit to adjust wordline voltage when a difference between a state of the wordline that existed when verifying placement of the memory cell and an expected state of the wordline for a subsequent read operation exceeds a second threshold.

6. The apparatus of claim 2, the multistrobe read module operable on the processor circuit to direct the precharge level of the bitline to be adjusted and the bitline refilled when time allocated to adjust wordline voltage between a first sense operation and a next sense operation exceeds a third threshold.

7. The apparatus of claim 2, the multistrobe module operable to direct the precharge level of the bitline to be adjusted and the bitline refilled between a first sense operation and a next sense operation when an offset between bitline read and bitline verify conditions exceeds a fourth threshold.

8. The apparatus of claim 1, the multistrobe module operable on the processor circuit to adjust, when a variation in bitline voltage during the read operation exceeds a fifth threshold, one or more of a value of a reference voltage to be used during a sense pulse of a sense operation, and a duration of the sense pulse.

9. The apparatus of claim 1, the multistrobe module operable on the processor circuit to adjust one or more of a value of a reference voltage to be used during a sense pulse of a sense operation, and a duration of the sense pulse when a variation in wordline voltage during the read operation exceeds a sixth threshold.

10. The apparatus of claim 1, comprising a digital display to present results of data read from the non-volatile memory.

11. A computer implemented method, comprising:
  performing a multistrobe read operation that comprises:
    setting a read operation to read a memory cell of a non-volatile memory over a multiplicity of sense operations, each sense operation of the multiplicity of sense operations to be performed under a different sense condition, the memory cell comprising a wordline;
    determining a state of the read operation subsequent a current sense operation;
    determining whether the state of the read operation subsequent the current sense operation is within a preset range; and
    scheduling a next sense operation to succeed the current sense operation of the multiplicity of sense operations without recharge of the wordline based on a determination that the state of the read operation is within the preset range, and with recharge of the wordline based on a determination that the state of the read operation is not within the preset range.

12. The computer implemented method of claim 11, comprising selectively adjusting one or more read parameters to be applied to read data from the non-volatile memory based upon an error rate of data read by performing the multiplicity of sense operations, the one or more read parameters including state of a bitline discharge path of the non-volatile memory, wordline voltage level of a wordline to read the memory cell of the non-volatile memory, and precharge level of the bitline.

13. The computer implemented method of claim 12, comprising:
  sending results of the multiplicity of sense operations for storing as encoded state confidence data, each sense condition comprising a combination of sense voltage and sense pulse duration; and
  scheduling the stored encoded state confidence data to be sent to an external device only after completion of the multiplicity of sense operations.

14. The computer implemented method of claim 12, comprising disabling the bitline discharge path when a duration of ramping of the wordline between consecutive sense operations exceeds a first threshold.

15. The computer implemented method of claim 12, comprising adjusting wordline voltage when a difference between a state of the wordline that existed when verifying placement of the memory cell and an expected state of the wordline for a subsequent read operation exceeds a second threshold.

16. The computer implemented method of claim 12, comprising directing the precharge level of the bitline to be adjusted and the bitline to be refilled when time allocated to adjust wordline voltage between a first sense operation and a next sense operation exceeds a third threshold.

17. The computer implemented method of claim 12, comprising directing the precharge level of the bitline to be adjusted and the bitline refilled between a first sense operation and a next sense operation when an offset between bitline read and bitline verify conditions exceeds a fourth threshold.

18. The computer implemented method of claim 11, comprising adjusting one or more of a value of a reference voltage to be used during a sense pulse of a sense operation, and a duration of the sense pulse when a variation in wordline voltage during the read operation exceeds a fifth threshold.

19. At least one non-transitory computer-readable storage medium comprising a plurality of instructions that, when executed, cause a system to:
  set a read operation to read a memory cell of a non-volatile memory over a multiplicity of sense operations, each sense operation of the multiplicity of sense operations to be performed under a different sense condition, the memory cell comprising a wordline;
  determine a state of the read operation subsequent a current sense operation;
  determine whether the state of the read operation subsequent the current sense operation is within a preset range; and
  schedule a next sense operation to succeed the current sense operation of the multiplicity of sense operations without recharge of the wordline based on a determination that the state of the read operation is within the preset range, and with recharge of the wordline based on a determination that the state of the read operation is not within the preset range.

20. The at least one non-transitory computer-readable storage medium of claim 19, comprising instructions that, when executed, cause a system to selectively adjust one or more read parameters to be applied to read data from the memory cell based upon an error rate of data read by performing the multiplicity of sense operations, the one or more read parameters including state of a bitline discharge path of the non-volatile memory, wordline voltage level of a wordline to read the memory cell of the non-volatile memory, and precharge level of the bitline.

21. The at least one non-transitory computer-readable storage medium of claim 20, comprising instructions that, when executed, cause a system to:
  send results of the multiplicity of sense operations for storing as encoded state confidence data; and schedule the stored encoded state confidence data to be sent to an external device only after completion of the multiplicity of sense operations.

22. The at least one non-transitory computer-readable storage medium of claim 20, comprising instructions that, when executed, cause a system to disable the bitline discharge path when a duration of ramping of the wordline between consecutive sense operations exceeds a first threshold.

23. The at least one non-transitory computer-readable storage medium of claim 20, comprising instructions that, when executed, cause a system to adjust wordline voltage when a difference between a state of the wordline that existed when verifying placement of the memory cell and an expected state of the wordline for a subsequent read operation exceeds a second threshold.

24. The at least one non-transitory computer-readable storage medium of claim 20, comprising instructions that, when executed, cause a system to direct the precharge level of the bitline to be adjusted and the bitline refilled when time allocated to adjust wordline voltage between a first sense operation and a next sense operation exceeds a third threshold.

25. The at least one non-transitory computer-readable storage medium of claim 20, comprising instructions that, when executed, cause a system to direct the precharge level of the bitline to be adjusted and the bitline refilled between a first sense operation and a next sense operation when an offset between bitline read and bitline verify conditions exceeds a fourth threshold.

26. The at least one non-transitory computer-readable storage medium of claim 19, comprising instructions that, when executed, cause a system to adjust, when a variation in bitline voltage during the read operation exceeds a fifth threshold, one or more of a value of a reference voltage to be used during a sense pulse of a sense operation, and a duration of the sense pulse.

27. The at least one non-transitory computer-readable storage medium of claim 19, comprising instructions that, when executed, cause a system to adjust one or more of a value of a reference voltage to be used during a sense pulse of a sense operation, and a duration of the sense pulse when a variation in wordline voltage during the read operation exceeds a sixth threshold.

* * * * *